United States Patent
Mandelman et al.

(10) Patent No.: US 6,911,687 B1
(45) Date of Patent: Jun. 28, 2005

(54) BURIED BIT LINE-FIELD ISOLATION DEFINED ACTIVE SEMICONDUCTOR AREAS

(75) Inventors: Jack A. Mandelman, Stormville, NY (US); Gerhard Kunkel, Radebeul (DE)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 965 days.

(21) Appl. No.: 09/598,789

(22) Filed: Jun. 21, 2000

(51) Int. Cl.[7] .................. H01L 27/108; H01L 29/76; H01L 29/94; H01L 31/119

(52) U.S. Cl. .................. 257/296; 257/488; 257/504; 257/905; 257/907

(58) Field of Search ................ 257/296, 488, 257/905, 907, 504

(56) References Cited

U.S. PATENT DOCUMENTS

| | | | |
|---|---|---|---|
| 5,410,169 A | 4/1995 | Yamamoto et al. | 257/301 |
| 5,793,075 A * | 8/1998 | Alsmeier et al. | 257/296 |
| 5,892,707 A | 4/1999 | Noble | 365/149 |
| 5,977,578 A * | 11/1999 | Tang | 257/296 |
| 5,981,332 A | 11/1999 | Mandelman et al. | 438/246 |

* cited by examiner

Primary Examiner—Ngân V. Ngô

(57) ABSTRACT

Active areas of a Dynamic Random Access Memory (DRAM) formed on a semiconductor substrate are defined by buried bit lines on two sides and by conductors separated from the semiconductor substrate by electrically insulating layers on two other sides. The conductors are electrically biased during operation of the DRAM to cause portions of the semiconductor substrate therebelow to increase in majority carrier concentration and thus to inhibit inversion thereof. Each buried bit line is formed in a trench in the semiconductor substrate. Each trench houses a separate bit line and is lined with an electrical insulator and has a conductor in a bottom portion thereof.

13 Claims, 2 Drawing Sheets

BURIED BIT LINE-FIELD ISOLATION DEFINED ACTIVE SEMICONDUCTOR AREAS

FIELD OF THE INVENTION

The invention relates, generally, to semiconductor devices, and more particularly, to structures which define active areas of semiconductor substrates (bodies), particularly those useful for memory cells of dynamic random accesss memories (DRAMS)

BACKGROUND OF THE INVENTION

DRAMS and SRAMS are used extensively in computer memories. Each DRAM cell is composed of a transistor, such as a metal oxide semiconductor field effect transistor (MOSFET), and a capacitor. Static random access memories (SRAMS) are based on a larger cell comprised of several transistors and capacitors.

Circuit designers focus on methods of device layouts which can increase device density and circuit speed. As techniques and tools are developed to handle larger wafers for improved yield, several design strategies have emerged.

One of these strategies disclosed in prior art is that memory cells can be achieved with high integration by forming word lines that lie between the source and drain regions and capacitors which use one of the source and drain regions as a storage node electrode. Also, the bit lines are buried in the semiconductor substrate and are electrically connected to the source or drain regions. However, the active area containing the MOSFET arrays is defined by a combination of the isolation regions and buried bit lines troughs. Overlay errors between the isolation mask and the buried bit lines mask result in a variation in the width of the buried bit lines conductors which increases the likelihood that bit lines opens will occur. A more serious result is that the alignment tolerances between these mask levels create a leakage path between two adjacent capacitor contact diffusions. Yet another concern associated with this design is that overlay errors between a buried bit line and isolation masks results in a variation in the dimensions of the active areas containing the transistors. This variation in active area leads to variation in electrical characteristics and reduced process yield. These defects in the cell design can render it inoperable.

A second strategy disclosed in prior art relies on a layout in which bit lines are not recessed beneath the upper surface of the silicon. This forces a pattern of conductive segments which must be wired with separate word lines conductors. Therefore, word lines and bit lines compete for the same space which results in a loss of surface area and a decrease in the packing density.

To write in and to read out information stored as bits in individual cells it is necessary to form orthogonal arrays of word lines and bit lines. Word lines and bit lines are connected to the gate and drain, respectively, of the transistor of each memory cell. One popular type of capacitor used in DRAMS is the "stacked capacitor" which is fabricated over a top surface of a semiconductor substrate. The source of the transistor of each memory cell is connected to a capacitor storage node of a stacked capacitor. The output terminals, the drains and sources, of an n-channel field effect transistor reverse function as current flow through the transistor reverses. For example, during a write of a logical "1" into a memory cell having an n-channel transistor and a stored logical "0", the output terminal of the transistor coupled to the bit line is the drain and the output terminal coupled to the capacitor is the source. During a read operation, with a "1" stored in the memory cell, the output terminal of the transistor coupled to the capacitor is the drain and the other output terminal coupled to the bit line is the source.

Stacked capacitors are popular because the capacitance can be increased as the overlapping area of the capacitor plates is increased., and the process complexity associated with deep trench processing is avoided.

Previous problems have been encountered when a via is used to make contact to a stacked capacitor. As a result of etching the via, the design line width of the bit lines can be effected. With design ground rules of <0.25 um today and moving toward 0.10 um in the not too distant future, any process step which effects the line width will raise serious questions of device reliability and manufacturability.

Another problem occurs when processing sequences in the formation of the transistors lead to the need for a deep contact hole. This leads to an increase in the distance from the bit lines to the surface of the semiconductor body which can result in poor filing of a contact hole. Poor contact hole filing can cause reliability problems as result of and lead to contact failures.

It is desirable to reduce many of these problems and provide an efficient structure which defines active areas of a semiconductor substrate in which circuits and/or memory cells can be formed.

SUMMARY OF THE INVENTION

Viewed from a first aspect, the present invention is directed to apparatus comprising a semiconductor body having a top surface, a plurality of separated trenches, and a plurality of second conductors. The plurality of separated trenches extend from the top surface into the semiconductor body. Each of the trenches is lined with an insulating material and filled with a first conductor which is electrically isolated from the semiconductor body by the insulating material. The plurality of second conductors is separated from the top surface by an electrically insulating layer. The plurality of second conductors intersect the plurality of trenches with the intersection of the trenches and the second conductors defining areas of the semiconductor body in which devices can be formed. Each of the first conductors has a sufficient length so as to facilitate connections to at least two active areas.

Viewed from a second aspect, the present invention is directed to an integrated circuit formed in and/or a silicon body having a top surface. The integrated circuit comprises a plurality of parallel trenches and a plurality of second conductors. The plurality of parallel trenches extends from the top surface into the silicon body. Each of the trenches is lined with an insulating material and filled with a first conductor which is electrically isolated from the semiconductor body by the insulating material. The plurality of second conductors are separated from the top surface by an electrically insulating layer. The plurality of second conductors intersect the plurality of trenches with the intersection of said trenches and said conductors defining areas of the semiconductor body in which devices can be formed. Each of the first conductors has a sufficient length so as to facilitate connections to at least two active areas.

Viewed from a third aspect, the present invention is directed to a dynamic random access memory (DRAM) having a plurality of memory cells arranged in rows and columns with each column being coupled to a bit line. The DRAM comprises a silicon body having a major surface, a plurality of separated trenches, and a plurality of separated second conductors which are separated from the top surface by an electrically insulating layer. The plurality of separated trenches extends from the major surface into the silicon body. Each of the trenches is lined with an insulating material and filled with a first conductor which is electrically isolated from the semiconductor body by the insulating material. The plurality of second conductors intersects the trenches with the intersection of the trenches and the second conductors defining a plurality of active areas of the semiconductor body in which memory cells can be formed. The active areas are adjacent each other and separated by the two of the trenches and by two of the second conductors. Each of the first conductors is of a sufficient length so as to facilitate an electrical connection to each of the active areas which contains memory cells of a given column of memory cells.

The invention will be better understood from the following more detailed description taken in conjunction with the accompanying drawings and claims.

The drawings are not necessarily to scale.

DETAILED DESCRIPTION

Figure 1:
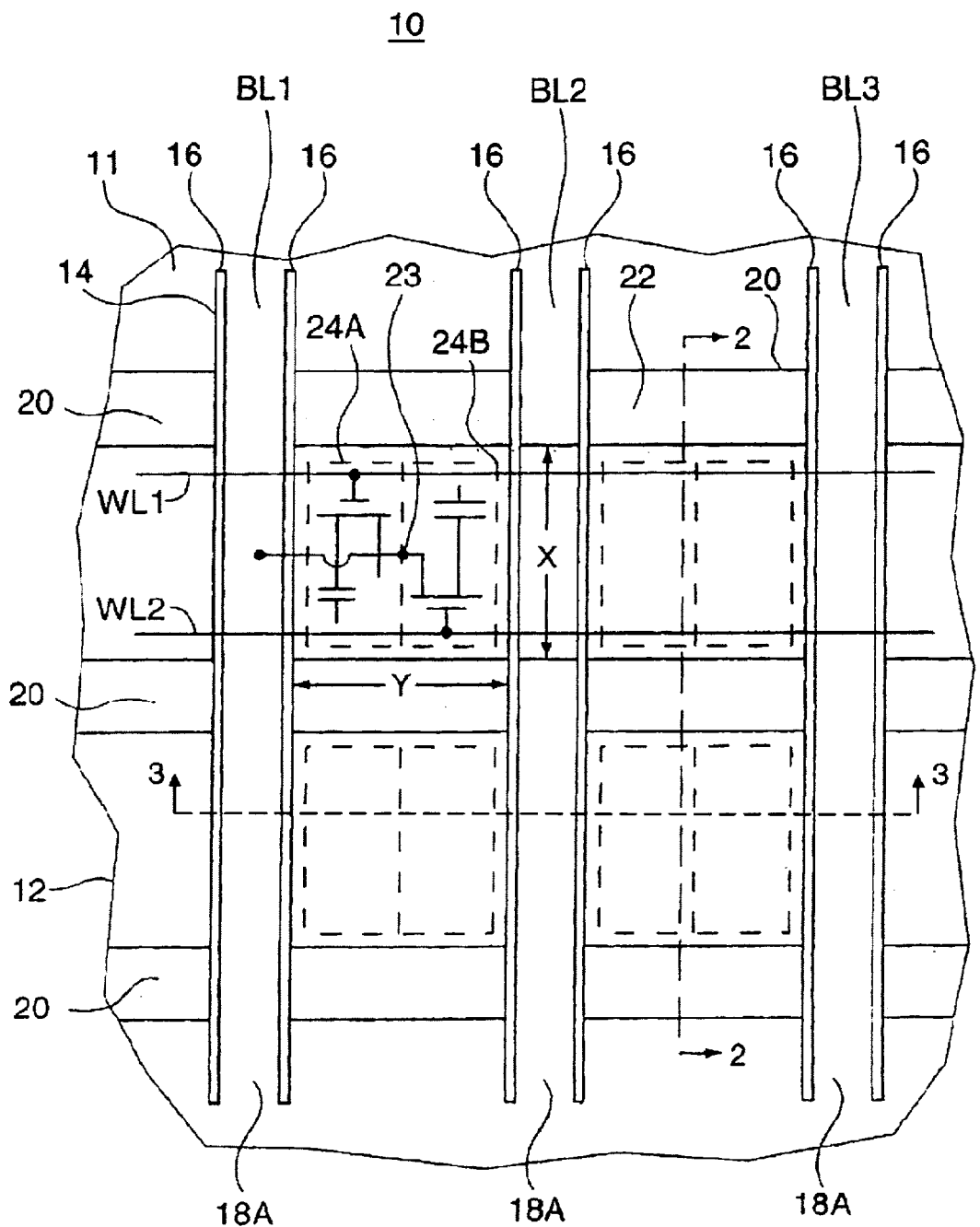
FIGS. 1, 2, and 3 show a schematic partially stripped away simplified top view (FIG. 1), a first cross-sectional view (FIG. 2) taken through a dashed line 2—2 of FIG. 1, and a second cross-sectional view (FIG. 3) taken through a dashed line 3—3 of FIG. 1, of a semiconductor structure in accordance with the present invention.
Figure 2:
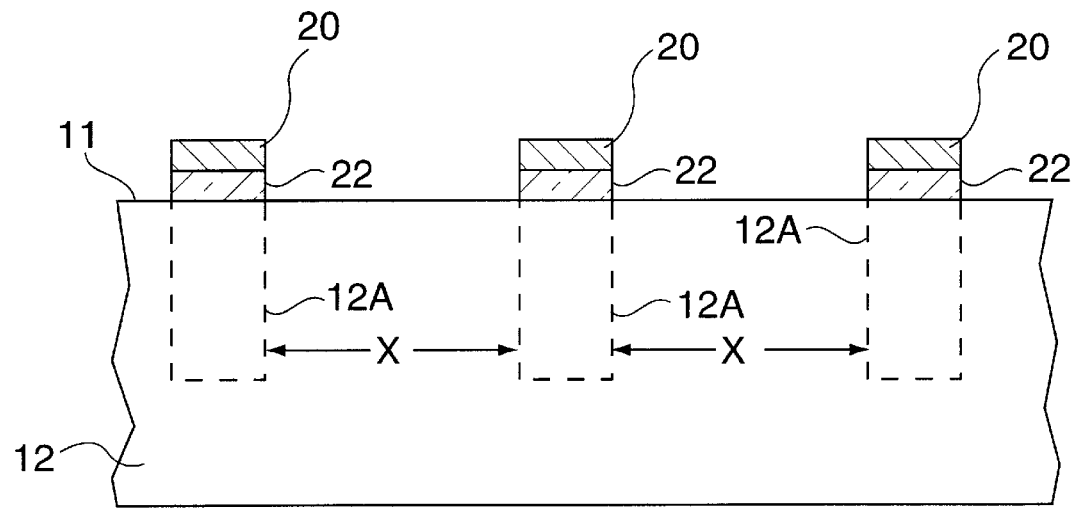
Figure 3:
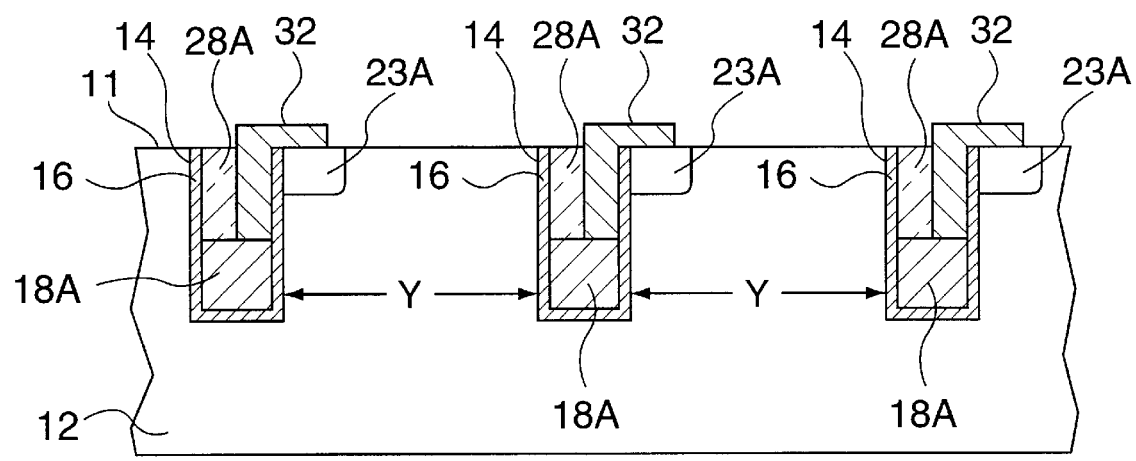

Referring now to FIGS. 1, 2, and 3, there are shown a schematic partially stripped away simplified top view (FIG. 1), a first cross-sectional view (FIG. 2) taken through a dashed line 2—2 of FIG. 1, and a second cross-sectional view (FIG. 3) taken through a dashed line 3—3 of FIG. 1, of a semiconductor structure 10 in accordance with the present invention. Semiconductor structure (apparatus, integrated circuit) 10 comprises a semiconductor body (substrate) 12 having a top surface 11 in which are formed a plurality of trenches 14 and a plurality of conductors 20 which crossover trenches 14 but which are electrically isolated therefrom by a dielectric layer 22 which is typically silicon dioxide. Each of trenches 14 is lined with an insulating layer 16 and is partly filled with a conductor 18A. The trenches 14 and the conductors 20 cross each other to define a plurality of "active areas" in which electrical devices can be formed such as memory cells of a DRAM. A DRAM typically has a plurality of memory cells arranged in rows and columns with a bit line coupled to each column of memory cells and a word line coupled to each row of memory cells. Each of these active areas has a width of "X" and a length of "Y". A variety of different types of semiconductor devices and/or circuits can be fabricated in each active area with different devices and/or circuits formed in various active areas.

The trenches 14 can be askew but separated from each other and the conductors 20 can also be askew and separated from each other. The active areas formed can be parallelograms, rectangular, square, trapezoidal, or comprise four sides.

Within one of the active areas there is shown within a first dashed line rectangle 24A a first memory cell comprising a field effect transistor and a capacitor (both shown in electrical schematic form) and within a second dashed line rectangle 24B is shown an essentially identical second memory cell which also comprises a field effect transistor and a capacitor. Drain regions of both transistors are shown coupled to a common node 23 with the source region of each transistor coupled to a terminal of the capacitor associated with that transistor. In an illustrative embodiment a single drain region 23A (shown in FIG. 3) is shared by both transistors. With the devices in an active area forming two memory cells, the common drains 23, which are typically combined in a common drain region 23A shown in FIG. 3, are coupled to conductor 18a which serves as a bit line 1 (BL1). For simplicity the drain region 23A is shown next to an insulating layer 16 of a trench 14 which contains a conductor 18A. Typically it would be located between the two memory cells occupying an active area. Three bit lines (BL1, BL2, and BL3) of a plurality of bit lines are shown in FIGS. 1 and 3. The gates of the transistors are each coupled to a separate word line with word line WL1 shown coupled to the gate of a transistors shown in dashed line rectangle 24A and the gate of the transistor shown in dashed line rectangle 24B coupled to a word line WL2. Each of the gates is typically a conductor separated from surface 11 by a gate dielectric layer (not shown). The gates associated with a given word line, which is a conductor that is typically doped polysilicon or a metal, are connected to that word line.

FIG. 3 shows that a portion of an opening above conductor 18A is filled with an insulating layer 28A and the remaining portion is filled with a conductor 32 which extends above the top surface 11 and thereacross to contact a common drain region 23A (shown only in FIG. 3) of the two transistors (shown schematically in FIG. 1).

FIG. 2 shows that each of the conductors 20 is separated from the surface 11 by and insulating layer 22. Below each of the insulating layers 22 is shown a separate portion 12A (within a dashed line rectangle) of substrate 12. With an appropriate voltage applied to conductors 20, the conductivity (majority carrier concentration) of the portions 12A of substrate 12 is increased above that of the remainder of substrate 12. This makes it more difficult to invert the conductivity of portions 12A when transistors within an active area are biased on by inverting (changing from one conductivity type to the other, e.g., changing from p-type to n-type) a surface portion of substrate 12 to create a channel region of the same conductivity type between a drain and a source region of the same conductivity type. This type of electrical isolation is sometimes denoted as field plate isolation and the combination of conductors 20 and dielectric layers 22 may be denoted as field plates.

In an illustrative embodiment structure 10 is used as dynamic random access memory (DRAM) with each active area having formed therein a pair of memory cells (shown within separate dashed line rectangles 24A and 24B with the trenches 14 being parallel to each other and the conductors 20 being parallel to each other and orthogonal to the trenches 14.

Various modifications are possible within the spirit and scope of the invention. For example, the opening in insulating layer 28 which is occupied by conductor 32 can be the full width of conductor 18a or can be through a central portion of insulating layer 28 which could extend over the entire width of conductor 18A. Further, a variety of electrical semiconductor compatible insulators other than those specifically denoted can be substituted for those denoted. Still further, the active areas can house a variety of circuitry other than memory cells and the buried conductors 18A can serve as power supply lines or interconnections between circuitry of different active areas. Still further, the buried conductors 18A need not be connected to portions of each of the active areas. Furthermore, the conductors 18A can be discontinuous so long as each length of conductor 18A is at least long enough to interconnect circuitry in two active areas. Still further, the plurality of conductors separated from the top surface of the semicondcutor body by an electrically insulating layer can be formed at the same time as word lines, which have essentially the same configuration, and may be denoted as "dummy word lines". Furthermore, a defined active area can contain just one memory cell or more than two memory cells.

What is claimed is:

1. Apparatus comprising:

a semiconductor body having a top surface;

a plurality of separated trenches extending from the top surface into the semiconductor body, each of said trenches being lined with an insulating material and filled with a first conductor which is electrically isolated from the semiconductor body by the insulating material;

a plurality of second conductors separated from the top surface by an electrically insulating layer, said plurality of second conductors intersecting the plurality of trenches with the intersection of said trenches and said second conductors defining areas of the semiconductor body in which devices can be formed; and each of the first conductors having a sufficient length so as to facilitate connections to at least two active areas.

2. An integrated circuit formed in and/or a silicon body having a top surface, said integrated circuit comprising:

a plurality of parallel trenches extending from the top surface into the silicon body, each of said trenches being lined with an insulating material and filled with a first conductor which is electrically isolated from the semiconductor body by the insulating material;

a plurality of second conductors separated from the top surface by an electrically insulating layer, said plurality of second conductors intersecting the plurality of trenches with the intersection of said trenches and said conductors defining areas of the semiconductor body in which devices can be formed; and each of the first conductors having a sufficient length so as to facilitate connections to at least two active areas.

3. A dynamic random access memory (DRAM) having a plurality of memory cells arranged in rows and columns with each column being coupled to a bit line, said DRAM comprising:

a silicon body having a major surface;

a plurality of separated trenches extending from the major surface into the silicon body, each of said trenches being lined with an insulating material and filled with a first conductor which is electrically isolated from the semiconductor body by the insulating material;

a plurality of separated second conductors separated from the top surface by an electrically insulating layer, said plurality of second conductors intersecting the trenches with the intersection of said trenches and said second conductors defining a plurality of active areas of the semiconductor body in which memory cells can be formed, said active areas being adjacent each other and separated by the two of the trenches and by two of the second conductors; and each of the first conductors being of a sufficient length so as to facilitate an electrical connection to each of the active areas which contains memory cells of a given column of memory cells.

4. The DRAM of claim 3 wherein:

the trenches of the plurality of trenches are parallel to each other; and the second conductors are parallel to each other and are orthogonal to the trenches such that the active areas are rectangular.

5. The DRAM of claim 3 wherein:

the trenches of the plurality of trenches the trenches are parallel to each other; and the second conductors are parallel to each other with the intersection of the trenches with conductors defining active areas which are parallelogram.

6. The DRAM of claim 3 wherein:

the trenches of the plurality of trenches being a askew to each other; and the second conductors are askew to each other with the intersection of the trenches with the second conductors defining active areas which each have four sides.

7. The DRAM of claim 3 in which at least one memory cell comprises a field effect transistor and a capacitor with the capacitor coupled to a first output terminal of the transistor.

8. The DRAM of claim 7 in which the capacitor is a stacked capacitor and a second output of the transistor is coupled to the conductor in one of the plurality of trenches.

9. The DRAM of claim 8 in which a gate of the transistor of the memory cell is coupled to a word line and the conductors in the plurality of trenches serve as bit lines of the DRAM.

10. The DRAM of claim 9 in which the conductor in each of the trenches is selected from a group consisting of a metal and doped polysilicon.

11. The DRAM of claim 3 wherein the insulating material is silicon oxide.

12. The DRAM of claim 7 wherein each active area comprises two memory cells which each comprise a field effect transistor and a capacitor.

13. The DRAM of claim 12 wherein the two transistors share a common drain region.

* * * * *